(12) United States Patent
Kondo

(10) Patent No.: US 11,524,429 B2
(45) Date of Patent: Dec. 13, 2022

(54) IMPRINTING APPARATUS AND METHOD OF MANUFACTURING PRODUCT

(71) Applicant: CANON KABUSHIKI KAISHA, Tokyo (JP)

(72) Inventor: Yousuke Kondo, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 572 days.

(21) Appl. No.: 16/435,147

(22) Filed: Jun. 7, 2019

(65) Prior Publication Data

US 2019/0291309 A1 Sep. 26, 2019

Related U.S. Application Data

(63) Continuation of application No. PCT/JP2017/044432, filed on Dec. 11, 2017.

(30) Foreign Application Priority Data

Dec. 13, 2016 (JP) ............................. JP2016-241685

(51) Int. Cl.
| | | |
|---|---|---|
| G03F 7/00 | (2006.01) | |
| B29C 37/00 | (2006.01) | |
| B29C 59/02 | (2006.01) | |
| H01L 21/027 | (2006.01) | |
| H01L 21/02 | (2006.01) | |

(52) U.S. Cl.
CPC .......... *B29C 37/0025* (2013.01); *B29C 59/02* (2013.01); *H01L 21/027* (2013.01); *B29C 2037/0046* (2013.01); *G03F 7/0002* (2013.01); *H01L 21/02* (2013.01)

(58) Field of Classification Search
CPC ..................................................... G03F 7/0002
See application file for complete search history.

(56) References Cited

U.S. PATENT DOCUMENTS

| | | | | |
|---|---|---|---|---|
| 2012/0141659 A1* | 6/2012 | Sato | ........................ | B05D 3/067 |
| | | | | 118/712 |
| 2015/0352776 A1* | 12/2015 | Ogasawara | ........... | G03F 7/0002 |
| | | | | 264/293 |
| 2015/0355558 A1* | 12/2015 | Miyajima | ............. | G03F 7/7035 |
| | | | | 355/72 |

FOREIGN PATENT DOCUMENTS

| | | |
|---|---|---|
| JP | 2015-233100 A | 12/2015 |
| JP | 2016-51862 A | 4/2016 |
| JP | 2016-111062 A | 6/2016 |

(Continued)

*Primary Examiner* — Timothy Kennedy
*Assistant Examiner* — Alexander A Wang
(74) *Attorney, Agent, or Firm* — Canon U.S.A., Inc. IP Division

(57) ABSTRACT

An imprinting apparatus 100 includes a control unit 126 that controls movement of a stage 104. During a period after a pattern is formed in a first region of regions until a pattern is formed in a second region that differs from the first region of the regions, the control unit 126 does not allow the first region to pass through a facing portion that faces a discharge ports 122b. After a predetermined time has elapsed since the discharging unit 106 finally discharges a imprint material 127 to the substrate with an airstream generated along a substrate from the facing portion at the facing portion that faces the discharge ports 122b, the control unit 126 controls movement of the stage such that the regions in which the pattern is formed are allowed to pass through the facing portion.

13 Claims, 11 Drawing Sheets

(56) References Cited

FOREIGN PATENT DOCUMENTS

| JP | 2016-134608 A | 7/2016 |
|---|---|---|
| WO | 2016/052345 A1 | 4/2016 |

\* cited by examiner

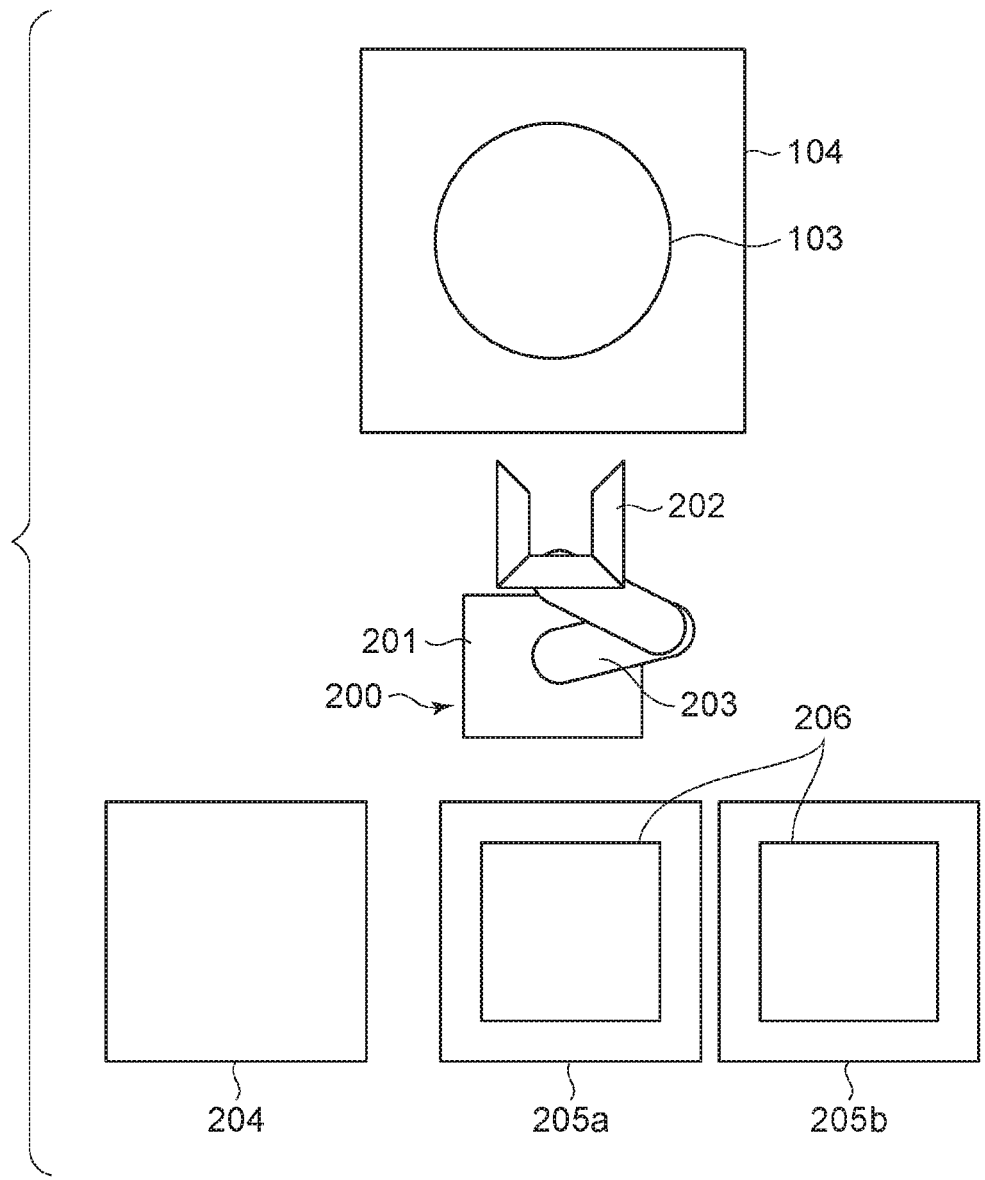

IMPRINTING APPARATUS AND METHOD OF MANUFACTURING PRODUCT

CROSS-REFERENCE TO RELATED APPLICATIONS

This application is a Continuation of International Patent Application No. PCT/JP2017/044432, filed Dec. 11, 2017, which claims the benefit of Japanese Patent Application No. 2016-241685, filed Dec. 13, 2016, both of which are hereby incorporated by reference herein in their entirety.

TECHNICAL FIELD

The present invention relates to an imprinting apparatus and a method of manufacturing a product.

BACKGROUND ART

An imprinting apparatus is known as an apparatus that forms a fine pattern on a substrate to manufacture, for example, a semiconductor device. The imprinting apparatus brings an imprint material on the substrate and a mold that includes a portion (referred to below as a pattern portion) having a pattern into contact with each other and gives energy for curing to the imprint material to form the pattern of the cured material.

In some cases, when a discharging unit of the imprinting apparatus discharges the imprint material, small droplets are produced and splash. As illustrated in FIG. 9, in some cases, a droplet 504 that splashes adheres to a pattern 501 of the imprint material that is cured on a substrate 503, and the pattern 501 collapses such that projections 501a of the pattern 501 approach each other.

PTL 1 discloses an imprinting apparatus that controls the order of formation of a pattern such that the pattern is formed in an imprint region upstream in the direction of an airstream in a chamber before the pattern is formed in an imprint region downstream in the direction of the airstream.

The pattern can collapse not only when the pattern is formed as disclosed in PTL 1 but also when the substrate is unloaded. It is necessary for the occurrence of collapse of the pattern to be decreased also in the case where the droplet that splashes from the discharging unit is left for some reason.

CITATION LIST

Patent Literature

PTL 1: Japanese Patent Laid-Open No. 2015-233100

SUMMARY OF INVENTION

An imprinting apparatus according to the present invention is an imprinting apparatus that forms a pattern of an imprint material in regions of a substrate by using a mold. The imprinting apparatus includes a discharging unit that has a discharge port and that discharges the imprint material from the discharge port, a stage that holds the substrate and that moves, and a control unit that controls movement of the stage. During a period after the pattern is formed in a first region of the regions until the pattern is formed in a second region that differs from the first region of the regions, the control unit does not allow the first region to pass through a facing portion that faces the discharge port. After a predetermined time has elapsed since the discharging unit finally discharges the imprint material to the substrate with an airstream generated along the substrate at the facing portion that faces the discharge port, the control unit controls movement of the stage such that the regions in which the pattern is formed are allowed to pass through the facing portion.

Further features of the present invention will become apparent from the following description of exemplary embodiments with reference to the attached drawings.

BRIEF DESCRIPTION OF DRAWINGS

FIG. 2 illustrates operation of a conveyance mechanism.

DESCRIPTION OF EMBODIMENTS

First Embodiment (Structure of Imprinting Apparatus)

Figure 1A:
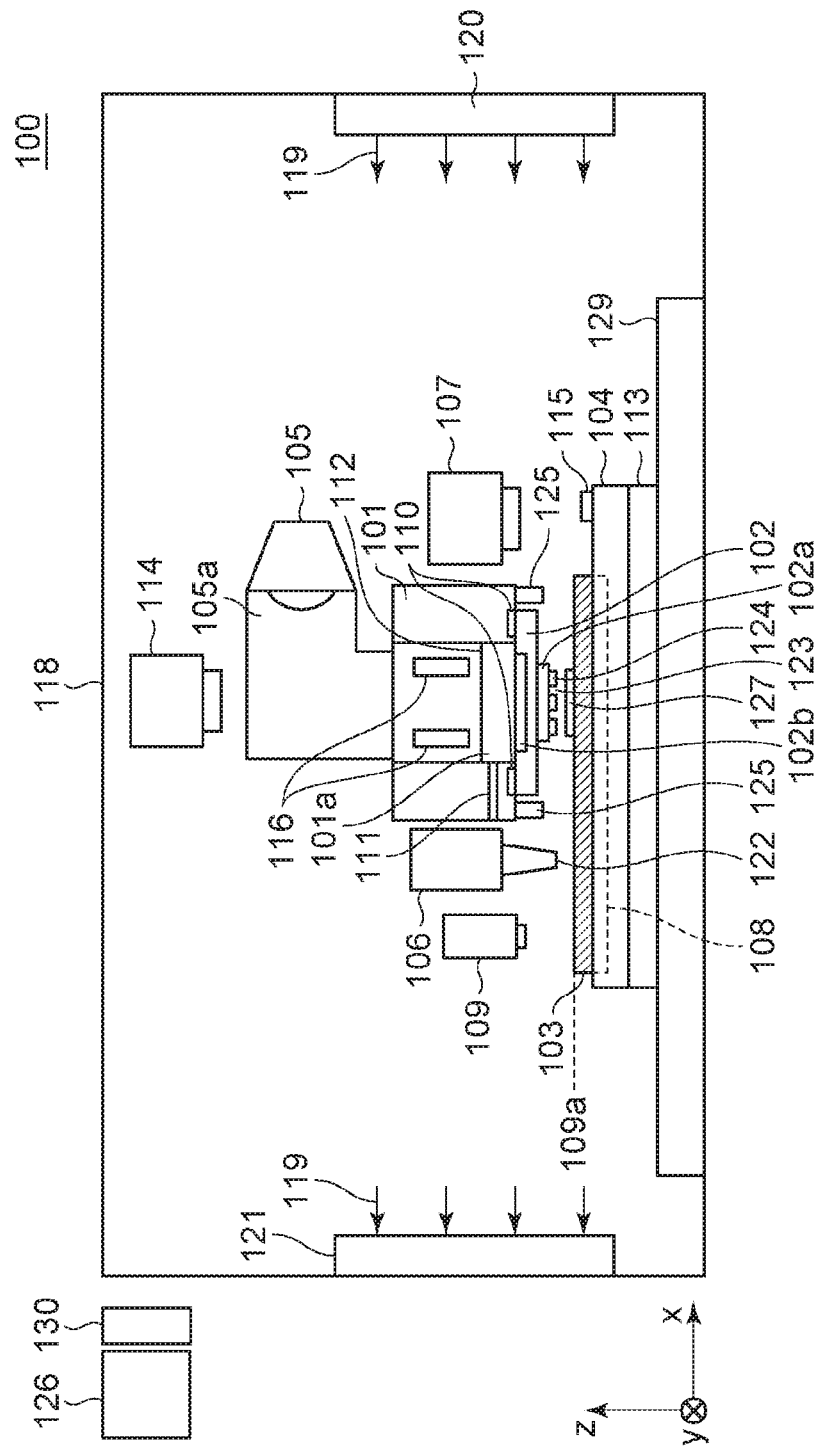
FIG. 1A illustrates the structure of an imprinting apparatus.

FIG. 1A illustrates the structure of an imprinting apparatus 100 according to the present embodiment. The imprinting apparatus 100 forms a pattern of an imprint material on a substrate 103 by using a mold 102. In FIG. 1, an axis that is parallel to the optical axis of light 105a that is emitted from a light source 105, passes through the mold 102, and is incident on the substrate 103 is referred to as the Z-axis (vertical direction according to the present embodiment). Two axes that intersect with each other at right angles in a plane that is perpendicular to the Z-axis are the X-axis and the Y-axis.

A stage 104 holds the substrate 103 by using a holder 108. The holder 108 is connected to a vacuum pump (not illustrated) and sucks and holds the substrate 103 by a vacuum suction force. The stage 104 moves above a surface plate 129 by using a driving mechanism 113. The stage 104 is movable in the directions of the X-axis, the Y-axis, and the Z-axis and rotation directions (θX, θY, and θZ) about the axes. Examples of the driving mechanism 113 include actuators such as a linear motor and a pulse motor.

A formation mechanism 101 includes a mold driving mechanism (not illustrated) that moves a mold holder 110 that sucks and holds the mold 102 by a vacuum suction force and the mold 102 in the Z-axis. The mold driving mechanism is used to bring an uncured imprint material 127 and the mold 102 into contact with each other and to separate the mold 102 from the cured imprint material 127. Consequently, a reverse pattern of an uneven pattern that is formed on a pattern portion 102a of the mold 102 is formed on the imprint material 127. A cylindrical space 101a is formed at a central portion of the formation mechanism 101. The imprint material 127 and the mold 102 may be brought into contact with each other and may be separated from each other by only movement of the stage 104 or movement of the formation mechanism 101 in conjunction with movement of the stage 104. An example of the direction of the separation is the direction of the Z-axis.

A pressure control unit (not illustrated) feeds gas via a pipe 111 and discharges the gas to control the pressure in the space 101a that is surrounded by a glass plate 112 and a recessed portion 102b of the mold 102. The pressure control unit increases the atmospheric pressure of the space 101a to a pressure higher than the atmospheric pressure in the imprinting apparatus 100. This causes the pattern portion 102a of the mold 102 to deform into a projecting shape in the direction toward the substrate 103.

The holder 108 and the mold holder 110 may hold the objects to be held by using an electrostatic force instead of a vacuum suction force.

The mold 102 includes, at a central portion, the pattern portion 102a that is rectangular and that has the uneven pattern. The recessed portion 102b is formed in a manner in which the surface of the mold 102 opposite the pattern portion 102a is dug at a depth of about 1 mm in the direction of the Z-axis. The pattern portion 102a includes recessed portions 123 and projections 124. The depth of each recessed portion and a digging depth range from several tens of nanometers to several hundreds of nanometers. The widths of the recessed portions 123 and the projections 124 range from several nanometers to several tens of nanometers.

An alignment system 116 detects marks (not illustrated) that are formed at the four corners of the pattern portion 102a and a mark (not illustrated) that is formed on the substrate 103. A control unit 126 obtains, for example, relative positions of the pattern portion 102a and shot regions of the substrate 103 and difference in shape therebetween on the basis of a detection result. Each shot region is a unit region of an underlying layer in which a pattern has been formed and is partitioned by a scribe line (not illustrated).

A single shot corresponds to a repetitive pattern that is formed by using a light exposure device that uses a reticle. The size of the single shot region is, for example, about 26 mm×33 mm. In the single shot region, a chip-size pattern or chip-size patterns that a user desires can be formed.

The material of the mold 102 is a material through which the light 105a that enables the imprint material 127 to cure can pass. Examples thereof include glass such as quartz glass, silicate glass, calcium fluoride, magnesium fluoride, and acrylic glass, sapphire, gallium nitride, and resin such as polycarbonate, polystyrene, acrylic resin, and polypropylene. A laminate of these materials may be acceptable.

An alignment system 107 detects an alignment mark (not illustrated) that is formed on the substrate 103 and a reference mark that is formed on the upper surface of a mark stand 115. The control unit 126 obtains the position of the substrate 103 with respect to the stage 104 on the basis of a detection result. The alignment system 116 detects a mark (not illustrated) that is formed on the mold 102 and the alignment mark on the substrate 103. On the basis of a moire signal (interference fringe) that is generated by the alignment mark and the mark that is formed on the mold 102, the alignment system 116 obtains misalignment and difference in shape between the pattern portion 102a and the shot regions in which the pattern of the imprint material 127 is formed.

An imaging unit 114 takes an image with the imaging unit 114 facing the substrate 103 during imprinting to observe a state in which the recessed portions 123 are filled with the imprint material 127. The control unit 126 determines whether there is a particle between the mold 102 and the substrate 103 on the basis of an imaging result of the imaging unit 114. A supply mechanism 125 supplies gas that is to be supplied to a space between the mold 102 and the substrate 103. An example of the gas is a helium gas. This facilitates filling the recessed portions 123 with the imprint material 127. A sensor 109 is an optical distance meter and measures a position 109a (surface position) of a surface of the substrate 103 in the direction of the Z-axis.

Figure 1B:
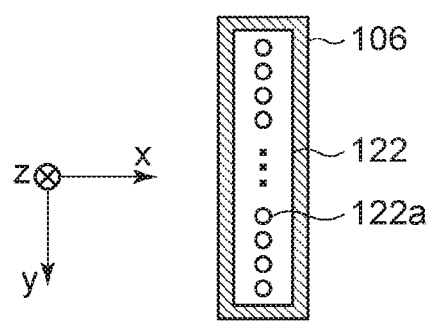
FIG. 1B illustrates the structure of the imprinting apparatus.

A discharging unit 106 includes a tank (not illustrated) that contains the uncured imprint material 127 and a nozzle 122 that discharges the imprint material 127. FIG. 1B illustrates the discharging unit 106 in the −Z direction. The nozzle 122 discharges the imprint material 127 from discharge ports 122a that are formed in the direction of the Y-axis. In FIG. 1B, the discharge ports 122a are formed in a row in the direction of the X-axis. However, the discharge ports 122a may be formed in rows in the direction of the X-axis.

The nozzle 122 discharges the imprint material 127 while the substrate 103 is scanned in the direction of the X-axis at a facing portion that faces the discharge ports 122a. Consequently, the imprint material 127 is supplied in a state of droplets to the substrate 103 or spreads on the substrate 103. The length of the nozzle 122 in the direction of the Y-axis is substantially equal to the length of a side of each shot region. The driving mechanism 113 adjusts the position of the stage 104 in the direction of the Z-axis, and consequently, a gap between the nozzle 122 and the substrate 103 in the direction of the Z-axis is adjusted to be several hundreds of micrometers to about 1 mm in size.

The stage 104 repeats reciprocating motion between the facing portion that faces the discharge ports 122a and a portion that faces the mold 102. Consequently, application of the imprint material 127 to the substrate 103 and formation of the pattern on the applied imprint material 127 are alternately repeated.

The components of the imprinting apparatus 100 are accommodated in a chamber 118. A gas-supplying unit 120 and a gas-collecting unit 121 serve as an air-conditioning mechanism inside the chamber 118. The gas-supplying unit 120 inhales atmospheric gas outside the chamber 118, removes chemical substances and dust that are contained in the inhaled gas by using a chemical filter or a particle filter, and supplies clean gas to the inside of the chamber 118. The gas-collecting unit 121 sucks the gas by using, for example, a vacuum pump.

The gas-supplying unit 120 and the gas-collecting unit 121 generate an airstream 119 that flows in the direction from +X toward −X inside the chamber 118. The airstream 119 may flow in a different direction.

The control unit 126 is connected to the formation mechanism 101, the light source 105, the discharging unit 106, the alignment system 107, the sensor 109, the driving mechanism 113, the imaging unit 114, the alignment system 116, and a storage unit 130. The storage unit 130 stores measurement results of, for example, various measurement instruments and the order of formation of the pattern that is set by the control unit 126. The control unit 126 reads a program that is stored in the storage unit 130 and executes the program while controlling the components that are connected to the control unit 126. The control unit 126 includes an arithmetic processing unit such as a CPU or a MPU and a storage device such as a memory.

The control unit 126 also functions as a determination unit that sets the order of formation of the pattern in the shot regions of the substrate 103. That is, the arithmetic processing unit of the control unit 126 can carry out arithmetic operation for setting the order of formation. A control signal is transmitted to the driving mechanism 113 to control movement of the stage 104 such that the set order of formation is achieved. The control unit 126 may be an aggregation of individual control substrates or may be a single control substrate, provided that the control unit 126 has the functions to be performed.

FIG. 2 illustrates operation of a conveyance mechanism (unloading unit) 200 that conveys the substrate 103. The conveyance mechanism 200 includes a hand 202 that holds the substrate 103, an arm 203 that can be stretched in XY directions and a rotation direction of the hand 202, and a driving mechanism 201 that can move the arm 203 in the direction of the Z-axis. For example, the conveyance mechanism 200 takes the substrate 103 out of a depository 204 that stores a plurality of the substrates 103, places the substrate 103 at a standby position 205a, loads the substrate 103 from the standby position 205a onto the stage 104, and unloads the substrate 103 from the stage 104 to a standby position 205b.

(Order of Formation of Pattern)

When the imprint material 127 is discharged from the nozzle 122, not only droplets hit the substrate 103, but also fog-like fine droplets (mist) are separated from the droplets. The following description is that the fine droplet adheres to the pattern of the imprint material 127 that is formed on the substrate 103. The order of formation of the pattern to decrease collapse of the pattern of the imprint material 127 due to the adhering droplet will be also described. According to the present embodiment, the order of formation of the pattern is set by the control unit 126 in advance. The control unit 126 causes the stage 104 to move such that the order of formation is achieved.

Figure 3:
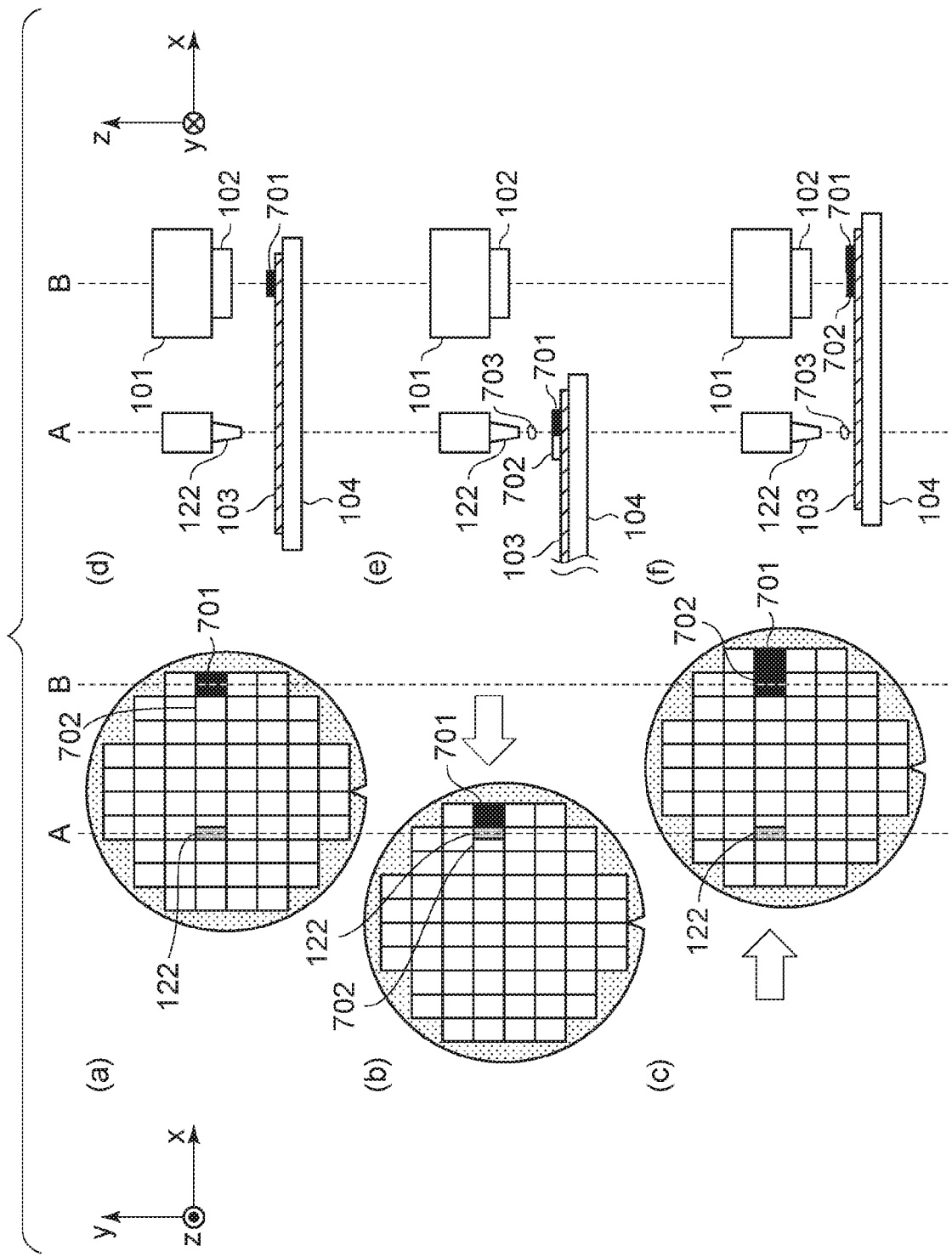
FIG. 3 illustrates the order of formation of a pattern according to a first embodiment.

FIG. 3 illustrates the order of formation of the pattern according to a first embodiment. FIG. 3 illustrates states where the pattern is formed in the same column of the shot regions (regions) that are two-dimensionally arranged on the substrate 103, that is, the shot regions that are adjacent to each other in the direction of the X-axis. An illustration of the recessed portions 123 and the projections 124 described above is omitted.

FIG. 3(a) to FIG. 3(c) illustrate the substrate 103 in the +Z direction. FIG. 3(d) to FIG. 3(f) illustrate the substrate 103 in the −Y direction. FIG. 3(a) and FIG. 3(d) illustrate concurrent states. FIG. 3(b) and FIG. 3(e) illustrate concurrent states. FIG. 3(c) and FIG. 3(f) illustrate concurrent states. Black shot regions represent shot regions in which the pattern of the cured imprint material 127 is formed.

FIG. 3(a) and FIG. 3(d) illustrate states where the pattern of the imprint material is formed in a shot region 701. FIG. 3(b) and FIG. 3(e) illustrate states where the nozzle 122 starts discharging the imprint material 127 so as to supply the imprint material 127 to a shot region 702. The imprint material 127 is discharged while the stage 104 moves in the +X direction. A fine droplet 703 is discharged at the same time as the imprint material 127 is discharged.

FIG. 3(c) and FIG. 3(f) illustrate states where the shot region 702 faces the mold 102, and formation of the pattern on the imprint material 127 that is supplied to the shot region 702 is finished. The droplet 703 drifts near the nozzle 122 during transition from the state in FIG. 3(b) to the state in FIG. 3(c). However, the shot region 701 in which the pattern is formed does not pass through the facing portion that faces the discharge ports 122a. Accordingly, the droplet 703 can be inhibited from adhering to the shot region 701 in which the pattern of the imprint material 127 is formed.

After the states illustrated in FIG. 3(c) and FIG. 3(f), the pattern is formed in order from the first row to N-th row in the same column and the pattern is formed again in order from the first row to N-th row in the adjacent column, where the rows are counted in order from the rightmost shot region of the substrate 103 such as the first row, the second row, the third row, . . . the n-th row.

Figure 4A:
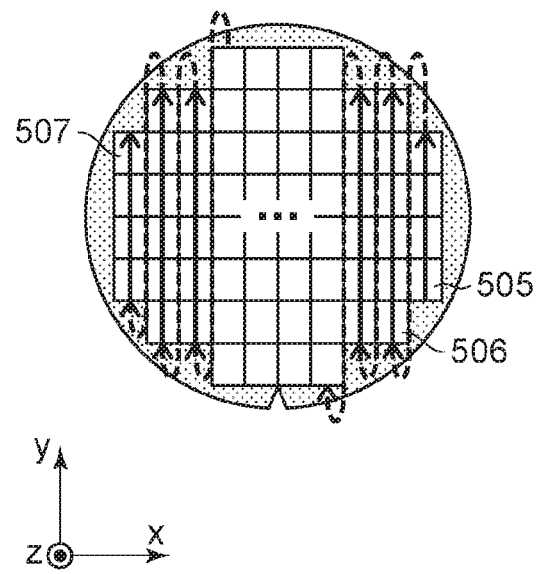
FIG. 4A illustrates another example of the order of formation of the pattern.

According to the present embodiment, the order of formation of the pattern is not limited to that illustrated in FIG. 3. FIG. 4 illustrates another example of the order of formation of the pattern in the shot regions. In FIG. 4A, the pattern is successively formed in the shot regions in the same row (the first row) from a shot region 505 at the lower right of the substrate 103. Subsequently, the pattern is successively formed in the shot regions in the second row from a lowermost shot region 506 in the adjacent row (the second row). The order of formation may be such that these are repeated in every row, and the pattern is finally formed in a shot region 507.

Figure 4B:
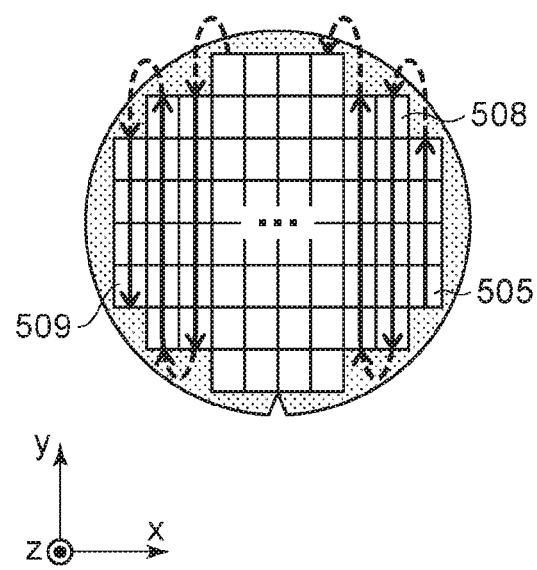
FIG. 4B illustrates another example of the order of formation of the pattern.

In FIG. 4B, the pattern is successively formed in the shot regions in the same row (the first row) from the shot region 505 at the lower right of the substrate 103. Subsequently, the pattern is successively formed in the shot regions in the second row from an uppermost shot region 508 in the adjacent row (the second row). The order of formation may be such that the pattern is successively formed in different rows in reciprocating order in the Y-axis direction, and the pattern is finally formed in a shot region 509.

That is, in the case where the first shot region (first region) and the second shot region (second region) are arranged in this order in the direction from the facing portion that faces discharge ports 122b to the portion that faces the mold 102, the pattern is formed in the second shot region before the pattern is formed in the first shot region. This order of formation is permitted, and another order of formation that is restricted (prohibited) enables the first shot region to pass through the facing portion that faces the discharge ports 122b during a period after the pattern of the imprint material 127 is formed in the first shot region until the pattern is formed in the second shot region.

Figure 10:
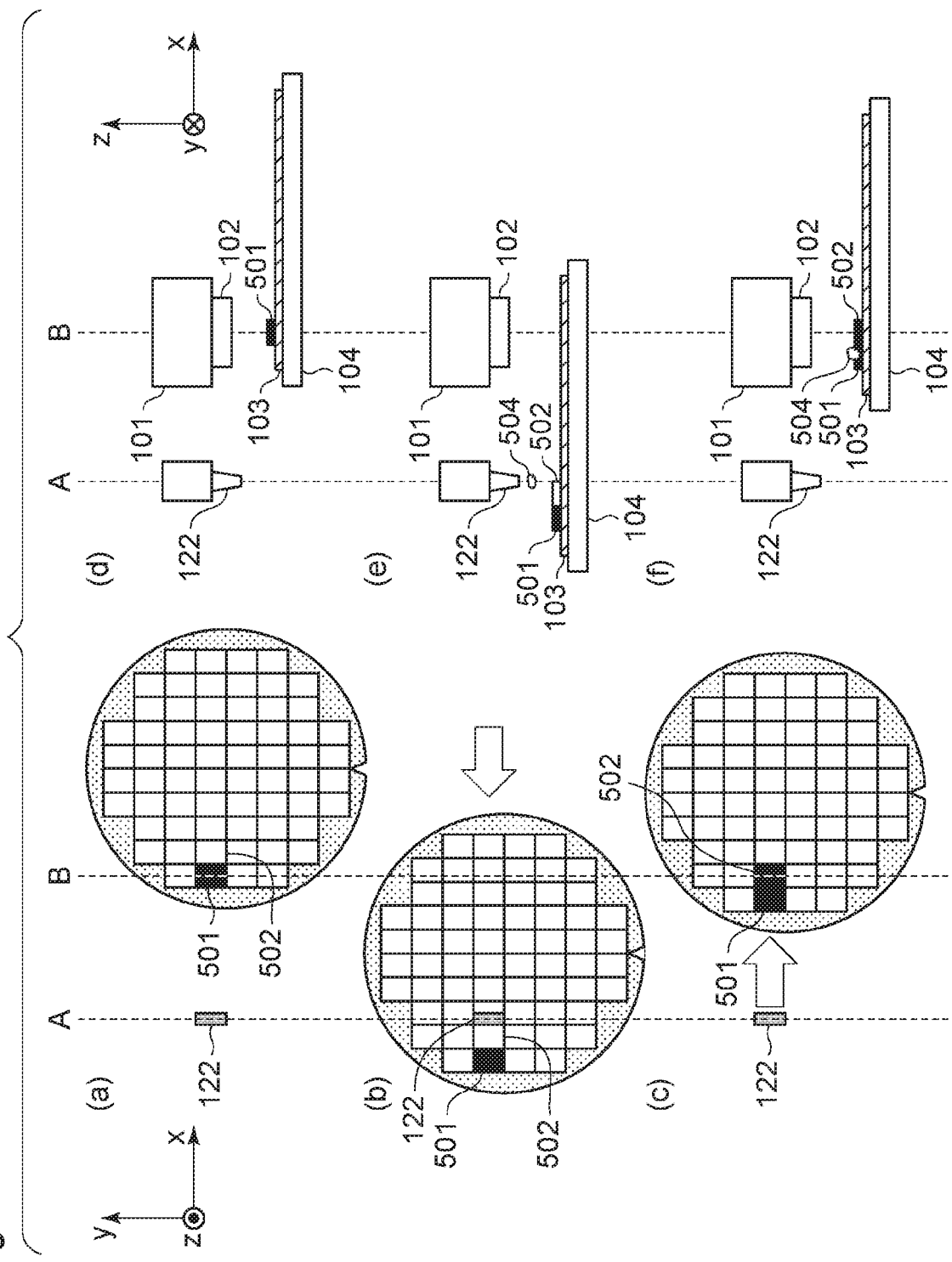
FIG. 10 illustrates an existing order of formation of a pattern.

FIG. 10 illustrates, as reference, an existing order of formation of a pattern, which ought to be restricted. FIG. 10(a) to FIG. 10(c) illustrate the substrate 103 in the +Z direction. FIG. 10(d) to FIG. 10(f) illustrate the substrate 103 in the −Y direction. FIG. 10(a) and FIG. 10(d) illustrate concurrent states. FIG. 10(b) and FIG. 10(e) illustrate concurrent states. FIG. 10(c) and FIG. 10(f) illustrate concurrent states. Black shot regions represent shot regions in which the pattern of the cured imprint material 127 is formed. If the pattern is previously formed in a shot region 501, the shot region 501 inevitably passes through the facing portion that faces the discharge ports 122b during movement for applying the imprint material 127 to a shot region 502. A fine droplet 504 is likely to adhere to the shot region 501.

The restriction (prohibition) of the order of formation as illustrated in FIG. 10 enables the fine droplet 703 that drifts at the portion that faces the discharge ports 122b to be inhibited from adhering to the pattern of the cured imprint material 127. This decreases the occurrence of collapse of the pattern of the imprint material that is formed on the substrate 103.

According to the present embodiment, the airstream below the discharge ports 122b is preferably generated in a direction that does not include a component of a direction from the facing portion that faces the discharge ports 122b toward the portion that faces the mold 102. The fine droplet 703 can be inhibited from adhering to the pattern that is formed on the substrate 103.

Second Embodiment

A second embodiment differs from the first embodiment in that the control unit 126 does not set the order of formation of the pattern but a user of the imprinting apparatus 100 can set the order of formation of the pattern unlike the first embodiment. However, the control unit 126 checks whether the order of formation enables the droplet 703 to be prevented from adhering to the formed pattern of the imprint material 127.

Figure 5:
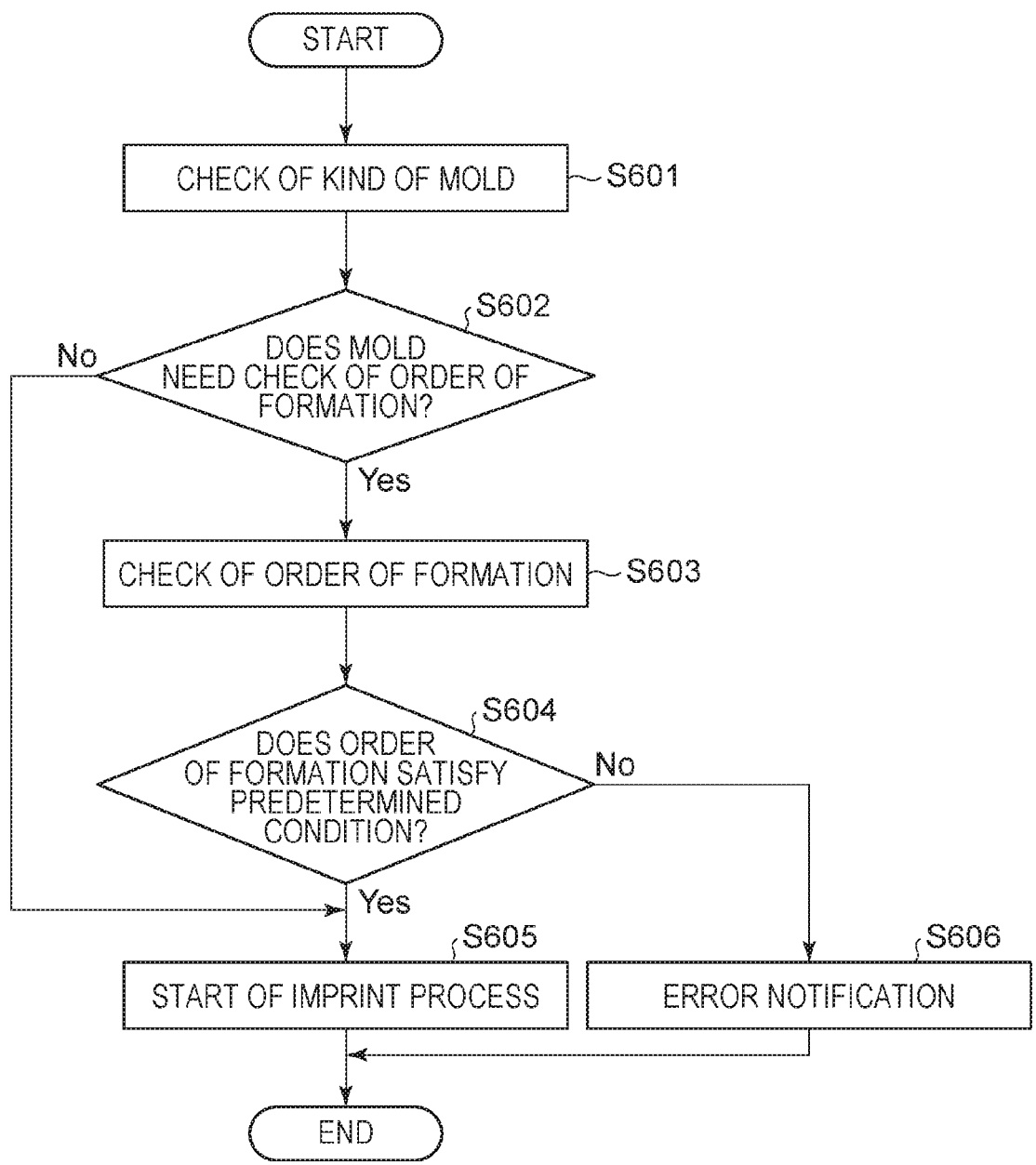
FIG. 5 is a flowchart illustrating a method of checking the order of formation of the pattern.

The imprinting apparatus 100 includes a user interface for setting the order of formation of the pattern by the user in addition to the above components. The user interface includes, for example a display and is connected to the control unit 126. A program illustrated in the flowchart in FIG. 5 is stored in the storage unit 130. The control unit 126 reads the program and checks the order of formation of the pattern. The kind of the mold 102 and whether the mold 102 needs check of the order of formation are associated with each other and are also stored in the storage unit 130. For example, the mold 102 needs check of the order of formation when the mold 102 has a pattern that has narrow pitches of the recessed portions 123 and the projections 124, or the longitudinal length (length in the direction of the Z-axis) of each projection 124 is equal to or more than two times the transverse length thereof.

FIG. 5 is a flowchart illustrating a method of checking the order of formation of the pattern. At a S601, the control unit 126 checks the kind of the mold 102 that is loaded in the imprinting apparatus 100. At a S602, the control unit 126 refers information that is stored in the storage unit 130 to determine whether the mold 102 that is loaded at the S601 needs check of the order of formation.

In the case where the control unit 126 determines that the mold does not need check of the order of formation (No) at the S602, the flow proceeds to a S605. An imprint process is performed on the substrate 103 that is loaded in the imprinting apparatus 100 in accordance with the order of formation of the pattern that is set by the user by using the user interface for the shot regions of the substrate 103. The order of formation of the pattern may not be the same as the order of formation described according to the first embodiment.

In the case where the control unit 126 determines that the mold needs check of the order of formation (Yes) at the S602, the flow proceeds to a S603, and the order of formation of the pattern that is set by the user by using the user interface is checked. At a S604, the control unit 126 determines whether the order of formation of the pattern satisfies a predetermined condition.

The predetermined condition means that a region in which the pattern of the imprint material 127 is previously formed does not pass through the facing portion that faces the discharging unit 106. A row number is counted from the row that is nearest to the edge of the substrate 103 in the +X direction such as the first row, the second row, ~, the N-th row. A column number is counted from the column that is nearest to the edge of the substrate 103 in the +Y direction such as the first column, the second column, ~, the N'-th column. In this case, the order is such that the pattern is previously formed in the shot region that is nearer to the edge in the +X direction, of two shot regions in the same column. The order of formation described according to the first embodiment is preferable.

In the case where the control unit 126 determines that the predetermined condition is satisfied (Yes) at the S604, the flow proceeds to the S605, the imprint process is performed on the loaded substrate 103 in accordance with the order of formation of the pattern that is set by the user by using the user interface. In the case where the control unit 126 determines that the predetermined condition is not satisfied (No) at the S604, that is, in the case where it is determined that the region in which the pattern of the imprint material 127 is previously formed is to pass through the facing portion that faces the discharging unit 106, the flow proceeds to a S606. At the S606, the control unit 126 notifies the user of an error. A method of notifying the user of the error may be performed in a manner in which that the order of formation is inappropriate is reported to the above interface, a predetermined light source is switched on, or a predetermined sound is emitted. After the error notification at the S606, the imprint process on the substrate 103 is not performed, and the program illustrated in the flowchart in FIG. 5 is finished.

In addition to the error notification at the S606, a prompt for resetting the order of formation of the pattern that satisfies the above predetermined condition may be displayed for the user. Alternatively, a recommended order of formation of the pattern that satisfies the above predetermined condition may be stored in the storage unit 130 in advance, and after the error notification at the S606, the imprint process may be performed in accordance with the recommended order of formation of the pattern.

The order of formation that enables the first shot region to pass through the facing portion that faces the discharge ports 122b during the period after the pattern of the imprint material 127 is formed in the first shot region until the pattern is formed in the second shot region is thus restricted. This inhibits the droplet that drifts at the portion that faces the discharge ports 122b from adhering to the pattern of the cured imprint material 127 and decreases the occurrence of collapse of the pattern of the imprint material that is formed on the substrate 103.

According to the present embodiment, the airstream below the discharge ports 122b is preferably generated in the direction that does not include a component of the direction from the facing portion that faces the discharge ports 122b toward the portion that faces the mold 102. The fine droplet 703 can be inhibited from adhering to the pattern that is formed on the substrate 103.

Third Embodiment

The following description is operation of unloading the substrate 103 after the imprint process for all of the shot regions of the substrate 103 is finished, that is, after the pattern is formed in the final shot region of the substrate 103. The pattern is formed in the shot regions of the substrate 103 such that each region in which the pattern is previously formed does not face the discharge ports 122b. To this end, the distance of movement of the stage 104 for application of the imprint material 127 and the imprint process may not be the shortest.

The stage 104 moves from a position P of the substrate stage 104 when the pattern is formed in the final shot region to a position P' at which the substrate 103 can be unloaded by the conveyance mechanism 200. Examples of the position P and the position P' include the center of the stage 104.

Figure 6:
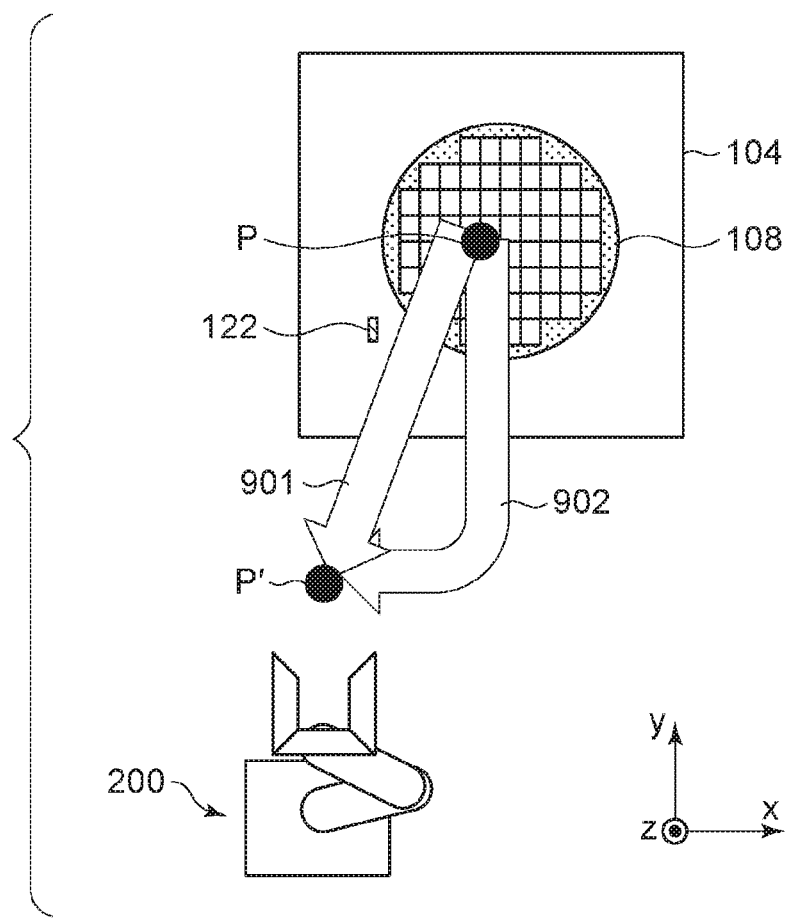
FIG. 6 illustrates an unload path for a substrate according to the first embodiment.

FIG. 6 illustrates an unload path for the substrate 103 and illustrates the stage 104 and the conveyance mechanism 200 in the +Z direction. Components like to the components described above are designated by like reference characters, and a detailed description is omitted. As illustrated in FIG. 6, the conveyance mechanism 200 is disposed nearer than the mold holder 110 to the discharging unit 106.

In this case, if the stage 104 moves along a path 901, which is the shortest path from the position P to the position P', as in an existing method, the shot region in which the pattern is formed inevitably passes through the facing portion that faces the discharge ports 122b. In the case where the fine droplet 703 that is generated when the nozzle 122 finally discharges droplets is left at the facing portion that faces the discharge ports 122b also during unloading of the substrate 103, there is a possibility that the fine droplet 703 adheres to the formed pattern and collapse of the pattern occurs.

In view of this, the control unit 126 sets the unload path for the substrate 103 at a detour. The detour means a path along which the shot regions in which the pattern is formed do not pass through the facing portion that faces the discharge ports 122b while the stage 104 is moved to the conveyance mechanism 200 after the pattern of the imprint material 127 is finally formed on the substrate 103. The detour can be a path that is not the shortest path from the position P to the position P'. A path 902 is an example of the detour. Along the path 902, the stage 104 moves such that the substrate 103 is away from the nozzle 122 in the −Y direction and subsequently moves to the conveyance mechanism 200.

Thus, the droplet that drifts at the portion that faces the discharge ports 122b is inhibited from adhering to the pattern of the cured imprint material 127 also during unloading, and the occurrence of collapse of the pattern of the imprint material that is formed on the substrate 103 can be decreased.

The detour is used to unload the substrate 103 only in the case where the control unit 126 determines that the detour is necessary depending on the kind of the mold 102. The airstream below the discharge ports 122b is preferably generated in the direction that does not include a component of the direction from the facing portion that faces the discharge ports 122b toward the portion that faces the mold 102 during formation of the pattern. The fine droplet 703 can be inhibited from adhering to the pattern that is formed on the substrate 103.

Fourth Embodiment

Figure 7A:
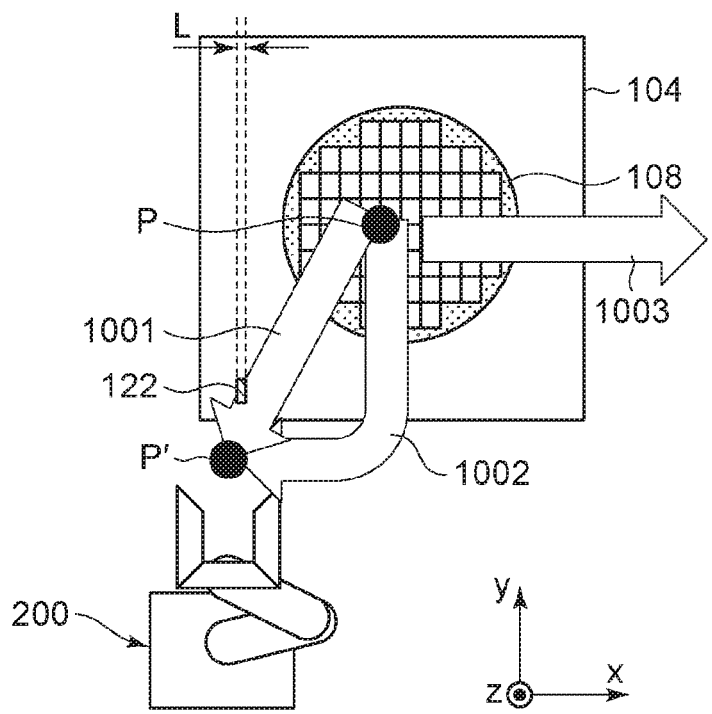
FIG. 7A illustrates an unload path for the substrate according to a second embodiment.
Figure 7B:
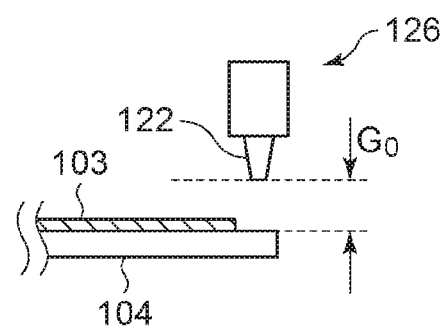
FIG. 7B illustrates the unload path for the substrate according to the second embodiment.

Operation of unloading the substrate 103 that differs from that according to a third embodiment will be described with reference to FIG. 7. FIG. 7A illustrates the vicinity of the stage 104 in the +Z direction. FIG. 7B illustrates the vicinity of the nozzle 122 in the −Y direction. The pattern is formed in the shot regions of the substrate 103 such that each region in which the pattern is previously formed does not face the discharge ports 122b. To this end, the distance of movement of the stage 104 for application of the imprint material 127 and the imprint process may not be the shortest.

As illustrated in FIG. 7, the nozzle 122 is near the conveyance mechanism 200. This is suitable for cases where there is no path along which the substrate 103 does not pass through the portion that faces the nozzle 122 (such as paths 1001 and 1002). The control unit 126 controls the stage 104 such that the pattern that is formed on the substrate 103 moves to the portion that faces the nozzle 122 after at least a predetermined time T has elapsed since the nozzle 122 finally discharges the imprint material.

As illustrated in FIG. 7A and FIG. 7B, L is the length of the discharge region of the nozzle 122 in the direction of the airstream 119, G is a gap from the nozzle 122 to an object that faces the nozzle 122, and G0 is a reference gap from the nozzle 122 to the stage 104. The length of the discharge region of the nozzle 122 means a distance between edges of the discharge port 122b that is used to apply the imprint material 127 among the discharge ports 122b that are arranged in the Y-axis direction. For example, the predetermined time T is given as the following expression (1) or expression (2) depending on the gap G.

$$T=L/V_0 (G>G_0)$$ Expression (1)

$$T=L/V_1 (G \leq G_0)$$ Expression (2)

The expression (1) is used when G is more than G0, for example, when the stage 104 does not face the discharge ports 122b. At this time, V0 is the speed of the airstream 119 below the nozzle 122.

The expression (2) is used when G is equal to or less than G0, for example, when the stage 104 faces the discharge ports 122b, or when the substrate stage 104 moves to a position nearer to the nozzle 122 than in normal operation. At this time, V1 is the speed of the airstream below the nozzle 122.

The reference gap $G_0$ is adjusted to several hundreds of micrometers to about 1 mm. When the gap G is equal to or less than the reference gap $G_0$, and the fine droplet 703 that drifts at the facing portion that faces the discharge ports 122b can be sufficiently discharged by the airstream 119 because the gap G is too narrow, $V_0$ may be nearly equal to 0.

The following description is an example of a method of adjusting time required for movement of the pattern that is formed on the substrate 103 to the portion that faces the nozzle 122 after the predetermined time T has elapsed. For example, the time is adjusted by suspending movement of the stage 104 along an XY plane until the predetermined time T has elapsed after the imprint material 127 is finally discharged to the substrate 103. When a time loss due to suspension of movement of the stage 104 and resumption of movement of the stage 104 is great, the stage 104 may be move along the detour such as the path 1002. Also, in this case, the stage 104 can be controlled such that the pattern that is formed on the substrate 103 moves to the portion that faces the discharge ports 122b after the predetermined time T has elapsed. Alternatively, the stage 104 may be moved in the +X direction with respect to the nozzle 122, for example, along a path 1003 to decrease the predetermined time T.

When the stage 104 is moved to a position at which the stage 104 does not face the nozzle 122, the object that the nozzle 122 faces is not the substrate stage 104 but is the surface plate 129. The gap G to the object that the nozzle 122 faces can thus satisfy the gap G >reference gap G0. An increase in the distance to the object that the discharge ports 122b face decreases the predetermined time T as described above.

The stage 104 may be moved in the −Z direction with the stage 104 facing the discharge ports 122b to increase the distance to the object that the discharge ports 122b face. After the predetermined time T has elapsed, the fine droplet 703 is discharged from the portion that faces the discharge ports 122b by the airstream 119. Accordingly, collapse of the pattern is unlikely to occur even when the formed pattern passes below the discharge ports 122b.

In an example described above, the airstream 119 flows in the direction from +X toward −X. However, the direction of the airstream 119 is not limited thereto, provided that the airstream flows along the substrate 103 at the facing portion that faces the discharge ports 122b such that the fine droplet 703 is not left.

Fifth Embodiment

According to a fifth embodiment, the imprinting apparatus 100 can evacuate the discharging unit 106. Specifically, the discharging unit 106 can move from a position (first position) at which the imprint material 127 is applied to an evacuation position (second position) away therefrom in the +Z direction in response to an instruction from the control unit (movement unit) 126.

While the pattern is successively formed in the shot regions of the substrate 103, or while the stage 104 is moved to the conveyance mechanism 200 after the imprint material 127 is finally discharged, the control unit 126 evacuates the discharging unit 106 to the evacuation position. The stage 104 is controlled such that each region in which the pattern of the imprint material 127 is formed passes through the facing portion that faces the discharge ports 122b while the discharging unit 106 is evacuated to the evacuation position.

An increase in the distance from the discharge ports 122b to the object such as the surface plate 129 or the stage 104 that faces the discharge ports 122b enables the fine droplet 703 to be discharged by the airstream 119. Accordingly, collapse of the pattern is unlikely to occur even when the formed pattern passes below the discharge ports 122b. While the discharging unit 106 is evacuated to the evacuation position, gas may be temporally supplied to the portion that faces the discharge ports 122b to increase a discharging force to the fine droplet 703.

Other Embodiments

Other embodiments that can be used for the above embodiments will be described. In the example described above, the gas-supplying unit 120 and the gas-collecting unit 121 generate the airstream 119 at the facing portion that faces the discharge ports 122b. However, the airstream 119 may be generated by an airstream-generating unit that is disposed near the nozzle 122. Alternatively, the airstream 119 may be generated by drawing atmospheric gas due to movement of the stage 104 in the horizontal direction (direction along the XY plane).

The stage 104 may include a flush plate (not illustrated) around the substrate 103. The flush plate is a plate that is disposed such that the height of a surface thereof is substantially the same as that of the substrate 103.

[Method of Manufacturing Product]

The pattern of the cured material that is formed by using the imprinting apparatus or another pattern of the cured material that is left after a substrate on which a latent pattern is formed by using a lithography device is developed is permanently used as at least a part of various products or temporally used when the various products are manufactured. Examples of the products include an electrical circuit element, an optical element, a MEMS, a print element, a sensor, and a mold.

Examples of the electrical circuit element include non-volatile or volatile semiconductor memories such as a DRAM, a SRAM, a flash memory, and a MRAM, and semiconductor elements such as a LSI, a CCD, an image sensor, and a FPGA. An example of the mold is an imprint mold.

The pattern of the cured material is used as a component of at least a part of the product without being processed or is temporally used as a resist mask. The resist mask is removed, for example, after etching or ion implanting during performing a process on a substrate. The process may include other known processes (such as developing, oxidization, film formation, vapor deposition, flattening, resist separation, dicing, bonding, and packaging).

FIG. 8 illustrate an example of the method of manufacturing a product by using the imprinting apparatus. In FIG. 8, only a region in which the pattern is formed by pressing once, and other portions of the substrate 103 are omitted. FIG. 8A to FIG. 8D illustrate the above imprint process (imprint method).

Figure 8A:
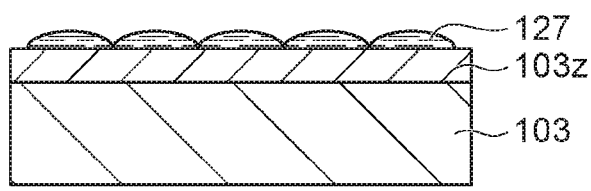
FIG. 8A illustrates a method of manufacturing a product.

In FIG. 8A, a supply unit 207 supplies the imprint material 127 to a surface of the substrate 103 where a processed material 103z such as an insulating material is formed on a surface of a base 2a. Here, the imprint material 127 in a state of droplets is supplied to the substrate 103.

Figure 8B:
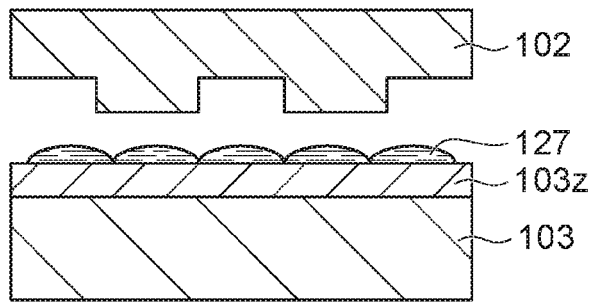
FIG. 8B illustrates the method of manufacturing the product.

As illustrated in FIG. 8B, the surface of the mold 102 on which the uneven pattern is formed is caused to face the imprint material 127 on the substrate 103.

Figure 8C:
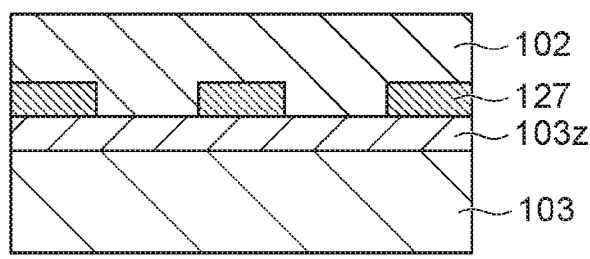
FIG. 8C illustrates the method of manufacturing the product.

As illustrated in FIG. 8C, the mold 102 is lowered, and the mold 102 and the imprint material 127 are brought into contact with each other. A predetermined pressure may be applied to the mold 102. A space between the mold 102 and the processed material 103z is filled with the imprint material 127. In this state, the light 105a is emitted from an irradiation unit 3 and passes through the mold 102, and the imprint material 127 is cured.

Figure 8D:
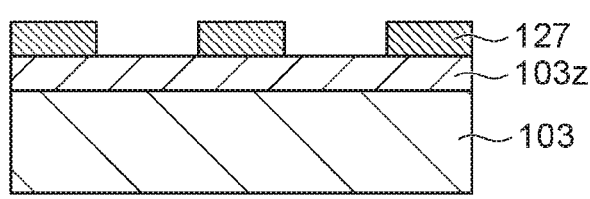
FIG. 8D illustrates the method of manufacturing the product.

The mold 102 and the substrate 103 are separated from each other after the imprint material 127 is cured. As illustrated in FIG. 8D, the pattern of the cured imprint material 127 is formed on the substrate 103. The shape of the pattern of the cured material is such that the recessed portions of the mold fit to the projections of the cured material and the projections of the mold fit to the recessed portions of the cured material. That is, a reverse pattern of the uneven pattern of the mold 102 is formed on the imprint material 127. The processes in FIG. 8A to FIG. 8D are repeated until the pattern of the cured material is formed in all of the regions of the substrate 103 in which the pattern is to be formed. The pattern of the cured material may be formed in all of the regions of the substrate 103 by pressing once.

Figure 8E:
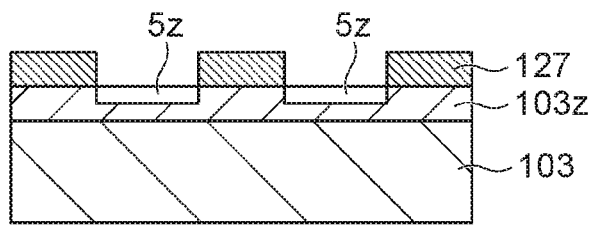
FIG. 8E illustrates the method of manufacturing the product.

A method of processing the substrate 103 by using the cured pattern will now be described. As illustrated in FIG. 8E, the formed pattern of the cured material is used as a mask for etching, parts of surfaces of the processed material 103z at which there is no cured material or the cured material deposited is thin are removed, and grooves 5z are formed.

Figure 8F:
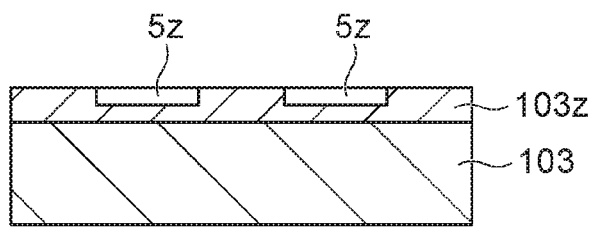
FIG. 8F illustrates the method of manufacturing the product.
Figure 9A:
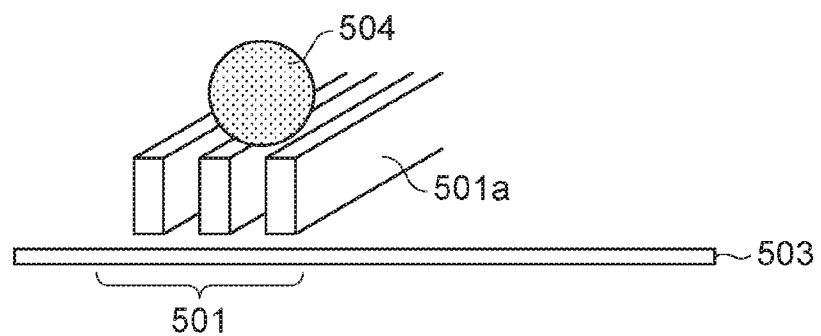
FIG. 9A illustrates collapse of the pattern.
Figure 9B:
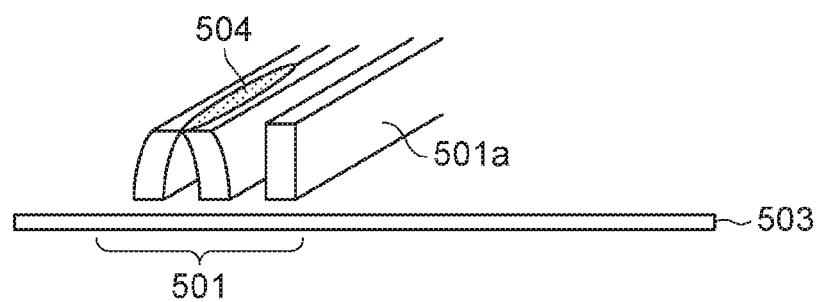
FIG. 9B illustrates the collapse of the pattern.

As illustrated in FIG. 8F, the pattern of the cured imprint material 127 is removed, and a product that has the grooves 5z that are formed on a surface of the processed material 103z can be obtained.

Preferred embodiments of the present invention are described above. It goes without saying that the present invention is not limited to the embodiments. Various modifications and alterations can be made within the range of the spirit thereof. Accordingly, the following claims are attached to make the scope of the present invention public.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprinting apparatus for forming a pattern of an imprint material in regions of a substrate by using a mold, the imprinting apparatus comprising:
a discharging unit including a discharge port configured to discharge the imprint material from the discharge port;
a stage configured to hold the substrate and move;
a determination unit configured to determine an order in which the pattern is formed in the regions such that, in a period from when the pattern is formed in a first region of the regions to when the pattern is formed in a second region different from the first region, the first region does not pass through a facing position facing the discharge port; and
a control unit configured to control movement of the stage, such that the pattern is formed in the regions according to the order and the regions in which the pattern is formed pass through the facing position after a predetermined period has elapsed since the discharging unit finally discharges the imprint material to the substrate with an airstream generated along the substrate at the facing position.

2. The imprinting apparatus according to claim 1, wherein, during the period, a distance between the discharge port and an object that faces the discharge port is increased in a direction in which the mold and the imprint material are separated from each other when the pattern is formed.

3. The imprinting apparatus according to claim 2, wherein the stage is moved from the facing portion to a position at which the stage does not face the discharge port, or the stage is moved in the direction with the stage facing the discharge port to increase the distance.

4. The imprinting apparatus according to claim 1, wherein the control unit stops movement of the stage along the substrate during at least a part of the period.

5. The imprinting apparatus according to claim 1, wherein the predetermined time is determined on the basis of on a direction of the airstream, a length of a discharge region of the discharging unit in the direction of the airstream, and a speed of the airstream at the facing portion.

6. The imprinting apparatus according to claim 5, the speed is determined by using a distance between the discharge port and an object that faces the discharge port.

7. The imprinting apparatus according to claim 1, wherein the discharging unit discharges the imprint material to the second region before the pattern is formed in the second region after the pattern is formed in the first region.

8. An imprinting apparatus for forming a pattern of an imprint material in regions of a substrate by using a mold, the imprinting apparatus comprising:
a movable discharging unit including a discharge port configured to discharge the imprint material from the discharge port;
a movement unit configured to move the discharging unit from a first position where the discharging unit discharges the imprint material to the substrate to a second position away from the first position in a direction in which the mold is separated from the imprint material when the pattern is formed;
a stage configured to hold the substrate and move; and
a control unit configured to control movement of the stage such that the regions in which the pattern is formed are allowed to pass through a facing portion that faces the discharge port after the movement unit moves the discharging unit.

9. The imprinting apparatus according to claim 8, further comprising: an unloading unit that unloads the substrate to an outside of the apparatus, wherein, while the stage is moved until the substrate reaches the unloading unit after the discharging unit finally discharges the imprint material to the substrate, the movement unit moves the discharging unit to the second position.

10. An imprinting apparatus for forming a pattern of an imprint material in regions of a substrate by using a mold, the imprinting apparatus comprising:
a discharging unit including a discharge port and configured to discharge the imprint material from the discharge port;
a stage configured to hold the substrate and move;
a holder configured to hold the mold;
an unloading unit disposed nearer than the holder to the discharging unit and configured to unload the substrate to an outside of the apparatus; and
a determination unit configured to determine an order in which the pattern is formed in the regions such that, in a period from when the pattern formed in a first region of the regions, the first region to when the pattern is formed in a second region of the regions different form the first region, the first region does not pass through a facing position facing the discharging port; and
a control unit configured to control movement of the stage such that the stage is moved to form the pattern in the regions according to the order, and further control movement of the stage such that, in a case where the regions passing through the facing position while the stage is moved to the unloading unit along a shortest path after the pattern is formed in a last one of the regions, the stage is moved along an evacuate path longer than the shortest path in such a manner that regions do not pass through the facing position.

11. The imprinting apparatus according to claim 10, further comprising:
an airstream-generating unit that generates an airstream at the facing portion,
wherein the airstream-generating unit generates the airstream in a direction that does not include a component of a direction from the facing portion toward a portion that faces the mold and at which the pattern is to be formed.

12. The imprinting apparatus according to claim 10, wherein the discharging unit discharges the imprint material to the second region before the pattern is formed in the second region after the pattern is formed in the first region.

13. A method of manufacturing a product, the method comprising:
- a step of forming a pattern on the substrate by using the imprinting apparatus according to claim 1; and
- a step of processing the substrate on which the pattern is formed at the step, wherein the product is manufactured from the processed substrate.

* * * * *